United States Patent
Kang et al.

(10) Patent No.: US 8,189,373 B2
(45) Date of Patent: May 29, 2012

(54) PHASE CHANGE MEMORY DEVICE USING A MULTIPLE LEVEL WRITE VOLTAGE

(75) Inventors: Hee Bok Kang, Chungcheongbuk-do (KR); Jin Hong An, Gyeonggi-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1007 days.

(21) Appl. No.: 12/146,583

(22) Filed: Jun. 26, 2008

(65) Prior Publication Data

US 2009/0040815 A1 Feb. 12, 2009

(30) Foreign Application Priority Data

Aug. 10, 2007 (KR) .................. 10-2007-0080669

(51) Int. Cl.
*G11C 11/00* (2006.01)
(52) U.S. Cl. .................. 365/163; 365/148; 977/754
(58) Field of Classification Search .................. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | | |
|---|---|---|---|---|
| 6,667,900 | B2 * | 12/2003 | Lowrey et al. | 365/171 |
| 6,768,665 | B2 * | 7/2004 | Parkinson et al. | 365/113 |
| 2002/0041947 | A1 * | 4/2002 | Chin et al. | 428/64.4 |
| 2003/0123284 | A1 * | 7/2003 | Lowrey et al. | 365/175 |
| 2005/0169093 | A1 * | 8/2005 | Choi et al. | 365/230.06 |
| 2006/0072370 | A1 * | 4/2006 | Kuh et al. | 365/232 |
| 2006/0151849 | A1 * | 7/2006 | Czubatyj | 257/467 |
| 2007/0297221 | A1 * | 12/2007 | Philipp et al. | 365/163 |
| 2008/0258129 | A1 * | 10/2008 | Toda | 257/5 |

FOREIGN PATENT DOCUMENTS

KR 1020050030294 A 3/2005
KR 1020050051135 A 6/2005

* cited by examiner

*Primary Examiner* — Alexander Sofocleous
*Assistant Examiner* — Harry W Byrne
(74) *Attorney, Agent, or Firm* — Ladas & Parry LLP

(57) ABSTRACT

A phase change memory device using a multiple level write voltage is described. The phase change memory device includes a cell array unit including a phase change resistance cell positioned at an intersection of a word line and a bit line. A voltage selection adjusting unit is configured to select one of a plurality of multiple voltages in response to a voltage adjusting signal to output a driving voltage. A write driving unit is also configured to finely adjust the voltage level of the driving voltage in response to a voltage fine-adjusting signal to supply the driving voltage to the cell array unit.

21 Claims, 10 Drawing Sheets

PHASE CHANGE MEMORY DEVICE USING A MULTIPLE LEVEL WRITE VOLTAGE

CROSS-REFERENCE TO RELATED APPLICATIONS

This application is based upon and claims the benefit of priority to Korean Patent Application No. 10-2007-80669, filed on Aug. 10, 2007, the entire contents of which are incorporated herein by reference.

BACKGROUND OF THE INVENTION

The present invention relates to a phase change memory device, and more particularly, to a technology for performing a write operation corresponding to a cell characteristic using a write voltage having multiple levels in a write mode.

Nonvolatile memory, including magnetic memory and phase change memory (PCM), has a data processing speed similar to that of volatile Random Access Memory (RAM) and conserves data even after power is turned off.

FIGS. 1a and 1b are diagrams illustrating a conventional phase change resistor (PCR) 4.

The PCR 4 comprises a phase change material (PCM) 2 formed between a top electrode 1 and a bottom electrode 3. A high temperature is generated in the PCM 2 when a voltage and a current are transmitted causing an electric conductive state change depending on the resistance of the PCM 2.

The PCM may include AgLnSbTe. The PCM 2 includes chalcogenide having chalcogen elements (S, Se, Te) as a main ingredient, and more specifically a germanium antimonic tellurium (Ge2Sb2Te5) consisting of Ge—Sb—Te.

FIGS. 2a and 2b are diagrams illustrating a principle of the conventional PCR 4.

As shown in FIG. 2a, the PCM 2 can be crystallized when a low current less than a threshold value flows in the PCR 4. As a result, the PCM 2 is crystallized as a low resistant material.

As shown in FIG. 2b, the PCM 2 has a temperature higher than a melting point when a high current more than a threshold value flows in the PCR 4. As a result, the PCM 2 becomes amorphous as a high resistant material.

In this way, the PCR 4 is configured to store nonvolatile data which corresponds to the two resistance states. Data "1" refers to when the PCR 4 is at a low resistance state and data "0" refers to when the PCR 4 is at a high resistance state. As a result, the logic states of the two data can be stored.

FIG. 3 is a diagram illustrating a write operation of a conventional phase change resistant cell.

Heat is generated when current flows between the top electrode 1 and the bottom electrode 3 of the PCR 4 for a given period of time. As a result, the PCM 2 is changed to a crystalline or amorphous state depending on a temperature given to the top electrode 1 and the bottom electrode 3.

When a low current flows for a given time, the PCM 2 changes to a crystalline state due to low temperature heating so that the PCR 4 which is a low resistor is at a set state. On the other hand, when a high current flows for a given time, the PCM 2 changes to an amorphous state due to high temperature heating so that the PCR 4, which is a high resistor, is at a reset state. A difference between two phases is represented by an electric resistance change.

A low voltage is applied to the PCR 4 for a long time to write the set state in a write mode. Conversely, a high voltage is applied to the PCR 4 for only a short time to write the reset state in the write mode.

However, the conventional phase change resistance cell has different characteristics determined by several process conditions. In a write mode, when data is written to all the phase change resistance cells with the same write voltage level, it is difficult to efficiently write data while considering the individual characteristics of each phase change resistance cell.

SUMMARY OF THE INVENTION

Various embodiments are directed to generating a driving voltage corresponding to a data state at a plurality of voltage levels to perform a write operation that corresponds to each characteristic of individual phase change resistance cells.

According to one embodiment, a phase change memory device comprises: a cell array unit including a phase change resistance cell positioned at an intersection of a word line and a bit line; a voltage selection adjusting unit to selecting one of a plurality of multiple voltages in response to a voltage adjusting signal to output a driving voltage; and a write driving unit fine-adjusting a voltage level of the driving voltage in response to a voltage fine-adjusting signal and supplying the driving voltage to the cell array unit.

According to one embodiment, a phase change memory device comprises: a cell array unit including a phase change resistance cell positioned at an intersection of a word line and a bit line; a voltage generating unit outputting one of a plurality of multiple voltages as a driving voltage according to a voltage adjusting signal; a voltage fine-adjusting unit finely adjusting a voltage level of the driving voltage according to a voltage fine-adjusting signal; and a write driving unit selectively supplying an output signal of the voltage fine-adjusting unit to the cell array unit.

DESCRIPTION OF SPECIFIC EMBODIMENTS

Figure 1A:
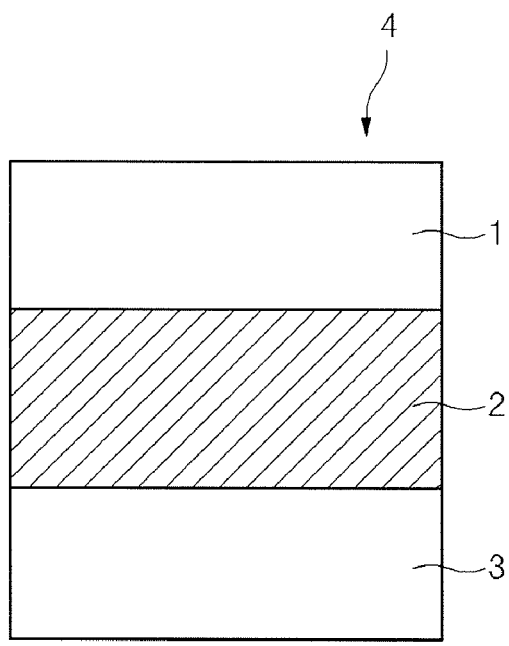
FIGS. 1a and 1b are diagrams showing a conventional phase change resistor.
Figure 1B:
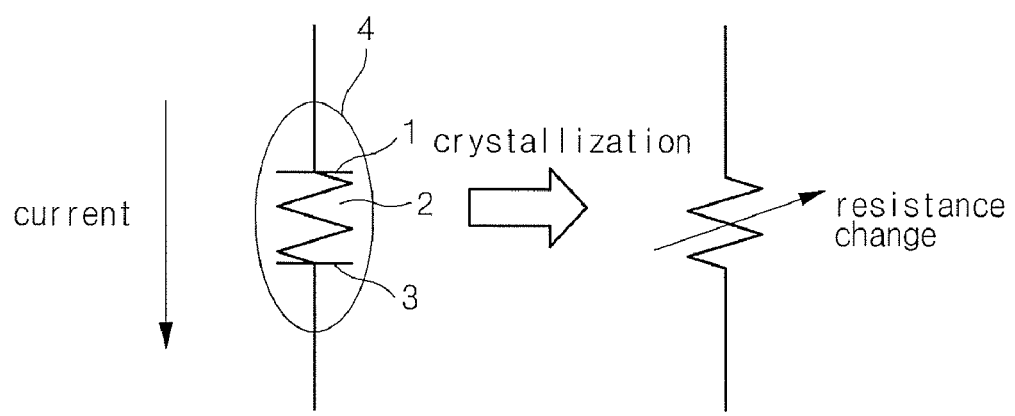
Figure 2A:
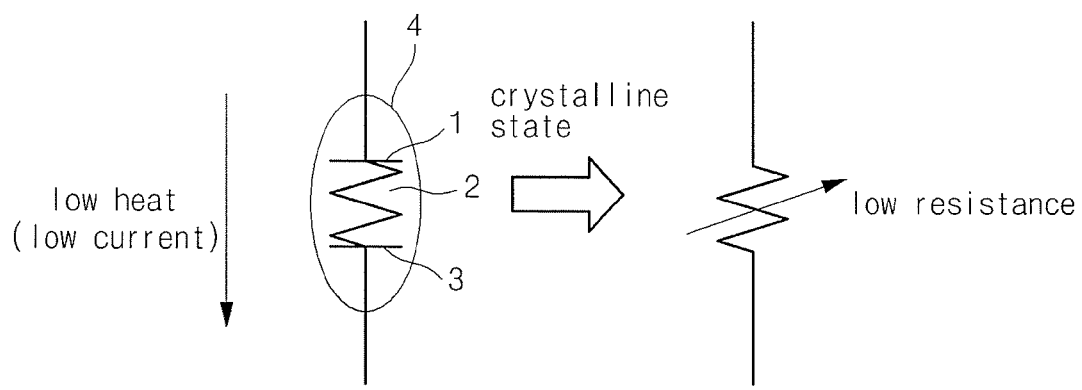
FIGS. 2a and 2b are diagrams showing a principle of the conventional phase change resistor.
Figure 2B:
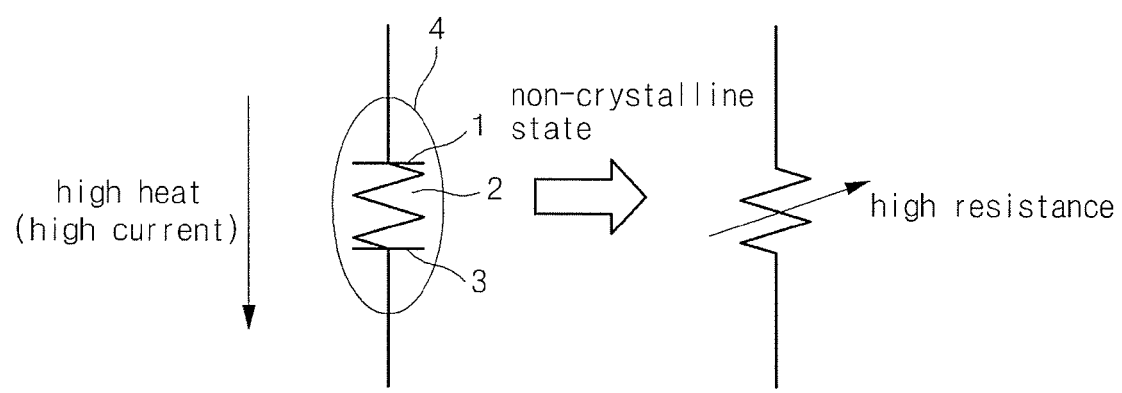
Figure 3:
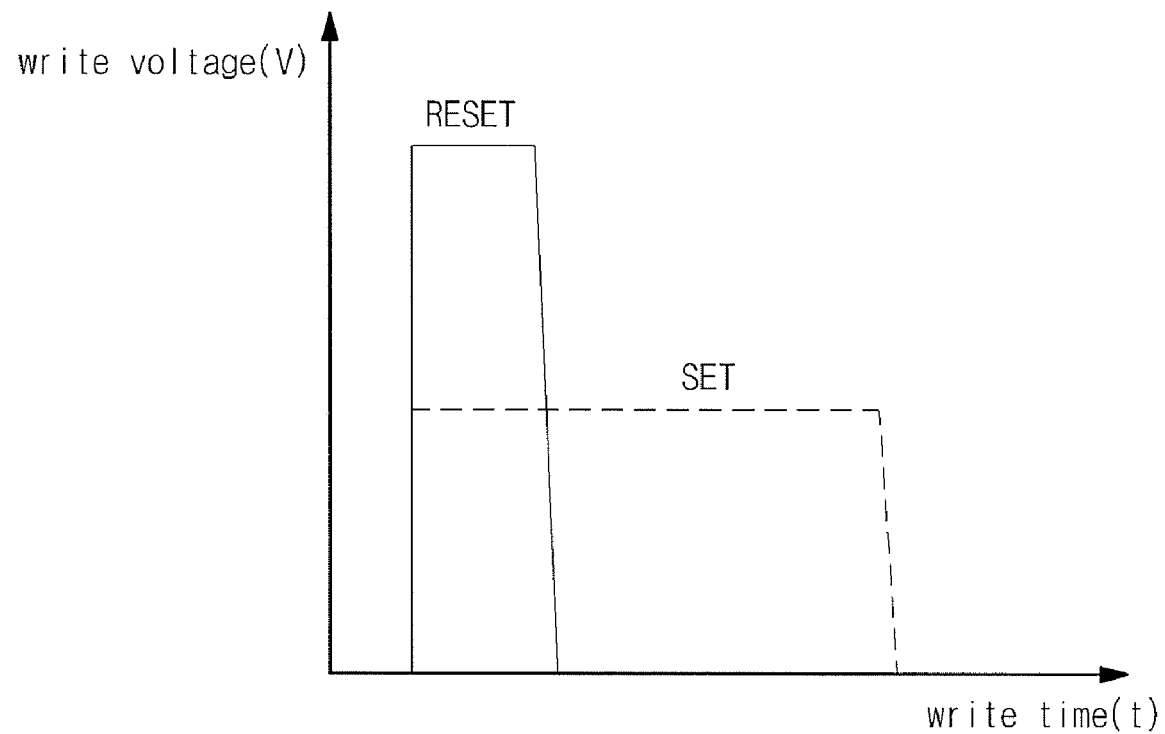
FIG. 3 is a diagram showing a write operation of a conventional phase change resistant cell.
Figure 4:
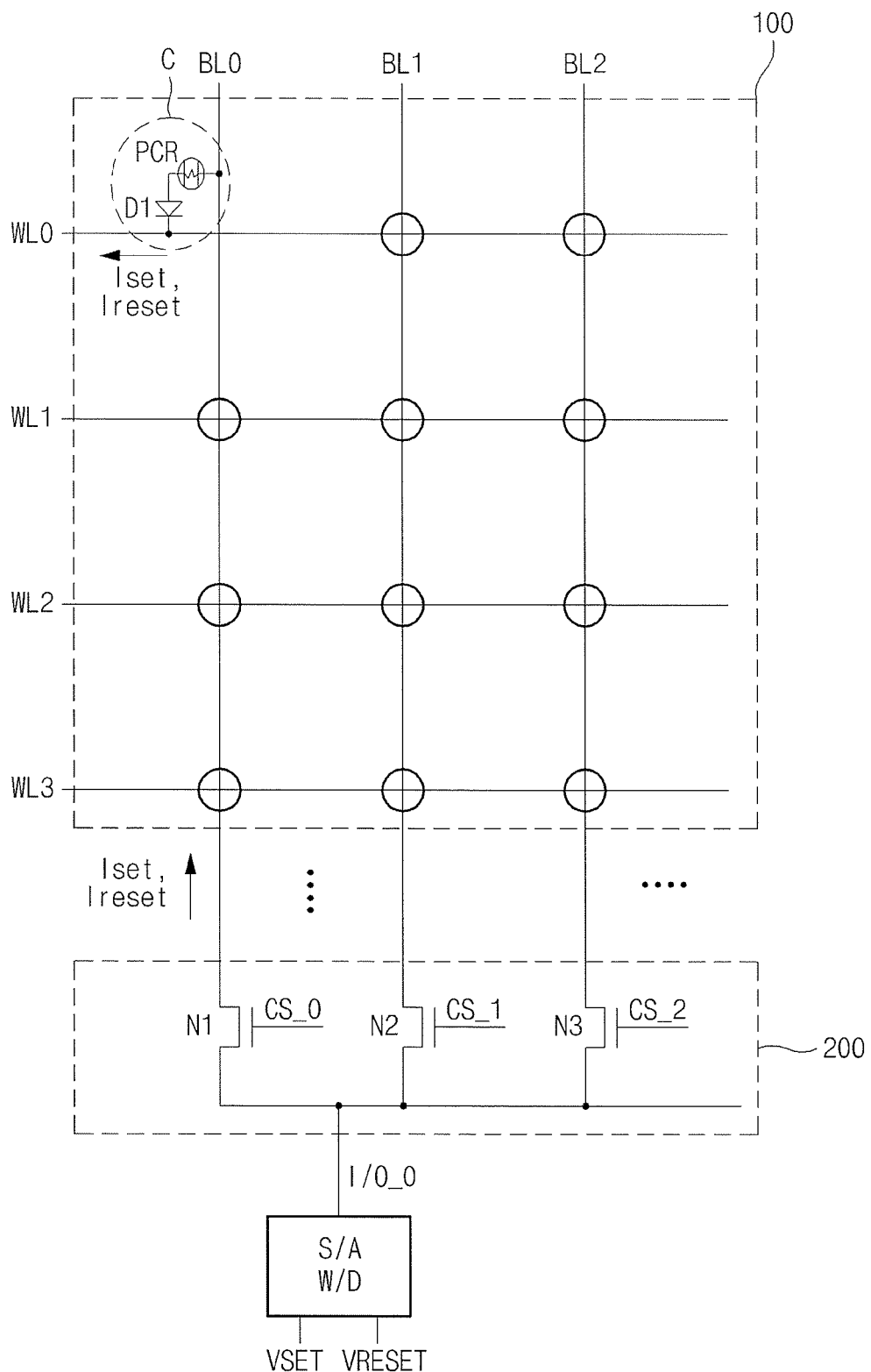
FIG. 4 is a circuit diagram showing a phase change memory device according to an embodiment of the present invention.

FIG. 4 is a circuit diagram showing a phase change memory device according to an embodiment of the present invention.

The phase change memory device of FIG. 4 comprises a cell array unit 100, a column selecting unit 200, a sense amplifier S/A, and a write driving unit W/D.

The cell array unit 100 includes a plurality of bit lines BL0~BL2 arranged in a column direction and a plurality of word lines WL0~WL3 arranged in a row direction. The cell array unit 100 includes unit cells C positioned at intersections of the bit lines BL0~BL2 and the word lines WL0~WL3. The unit cell C includes a phase change resistor PCR and a PN diode D1.

The phase change resistor PCR has one terminal connected to the bit line BL and the other terminal connected to a P-type region of the PN diode D1. The PN diode D1 has a P-type region connected to one terminal of the phase change resistor PCR and a N-type region connected to the word line WL.

In the phase change resistance cell C, a phase of the phase change resistor PCR is changed according to a set current Iset and a reset current Ireset flowing through the bit line BL to write data.

The column selecting unit 200 includes a plurality of switching elements each connected between the bit lines BL0~BL2 and an input/output line I/O_0 and having a gate to receive a plurality of column selecting signals CS_0~CS_2. The switching elements include NMOS transistors N1~N3.

The sense amplifier S/A senses cell data received through the input/output line I/O_0 to distinguish between a data "1" and "0". The write driving unit W/D receives a set voltage VSET and a reset voltage VRESET when data is to be written in the cell.

Figure 5:
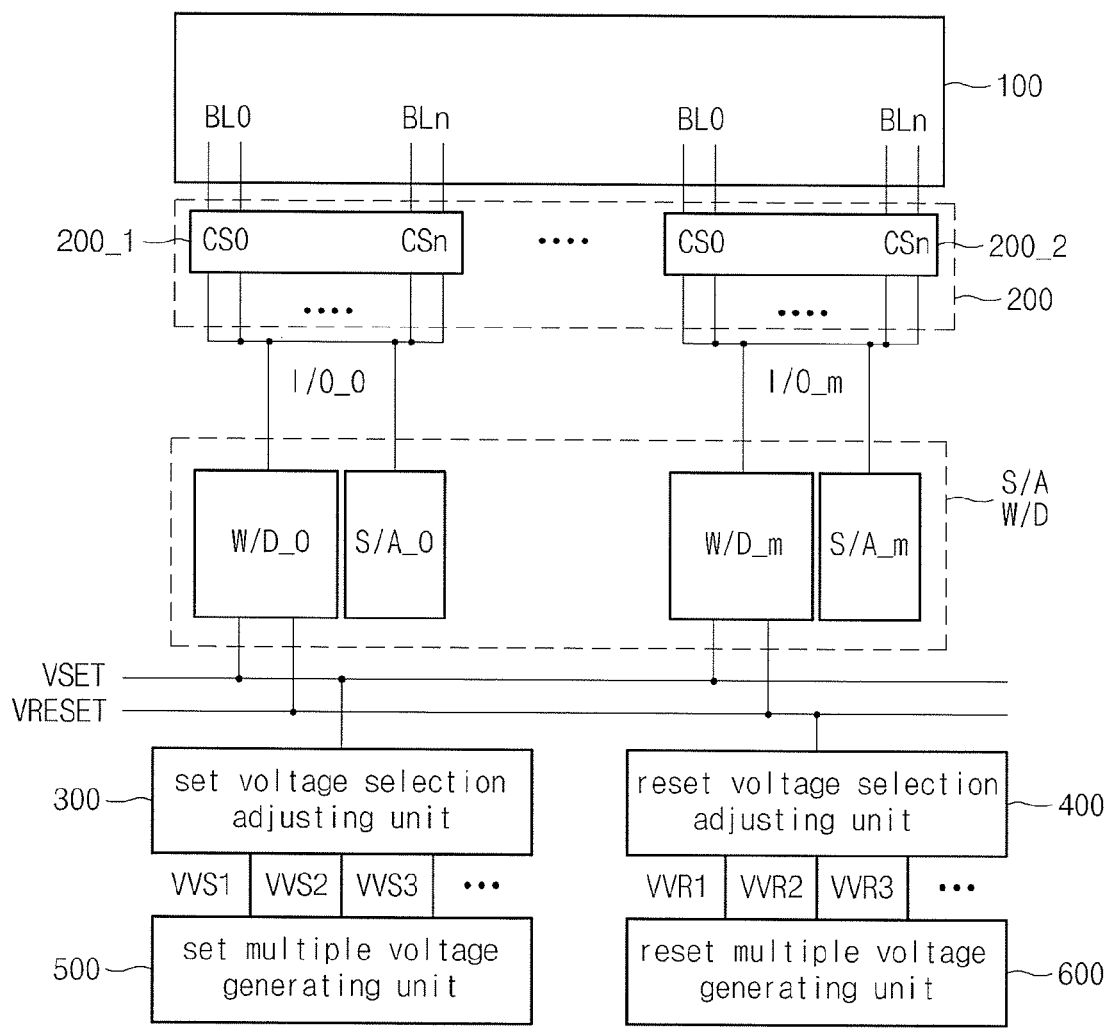
FIG. 5 is a block diagram showing a phase change memory device according to an embodiment of the present invention.

FIG. 5 is a block diagram showing a phase change memory device according to an embodiment of the present invention.

The phase change memory device of FIG. 5 comprises a cell array unit 100, a column selecting unit 200, a sense amplifier S/A, a write driving unit W/D, a set voltage selection adjusting unit 300, a reset voltage selection adjusting unit 400, a set multiple voltage generating unit 500, and a reset multiple voltage generating unit 600.

The column selecting unit 200_1 has a terminal connected to each bit lines BL0~BLn and the corresponding other terminal connected in common to an input/output line I/O_0. The column selecting unit 200_2 has a terminal connected to each bit lines BL0_BLn and the corresponding other terminal connected in common to an input/output line I/O_m.

The sense amplifier S/A_0 and the write driving unit W/D_0 are connected to the input/output line I/O_0. The sense amplifier S/A_m and the write driving unit W/D_m are connected to the input/output line I/O_m. The write driving unit W/D_0~W/D_m are connected to a set voltage VSET receiving terminal and a reset voltage VRESET receiving terminal.

The set voltage selection adjusting unit 300 receives a plurality of set multiple voltages VVS1~VVS3 to selectively output the multiple voltage to the set voltage VSET receiving terminal. The reset voltage selection adjusting unit 400 receives a plurality of reset multiple voltages VVR1~VVR3 to selectively output the multiple voltage to the reset voltage VRESET receiving terminal.

The set multiple voltage generating unit 500 outputs a plurality of set multiple voltages VVS1~VVS3, each of which having a different voltage level, to the set voltage selection adjusting unit 300. The reset multiple voltage generating unit 600 outputs a plurality of reset multiple voltages VVR1~VVR3, each of which having a different voltage level, to the reset voltage selection adjusting unit 400.

Figure 6:
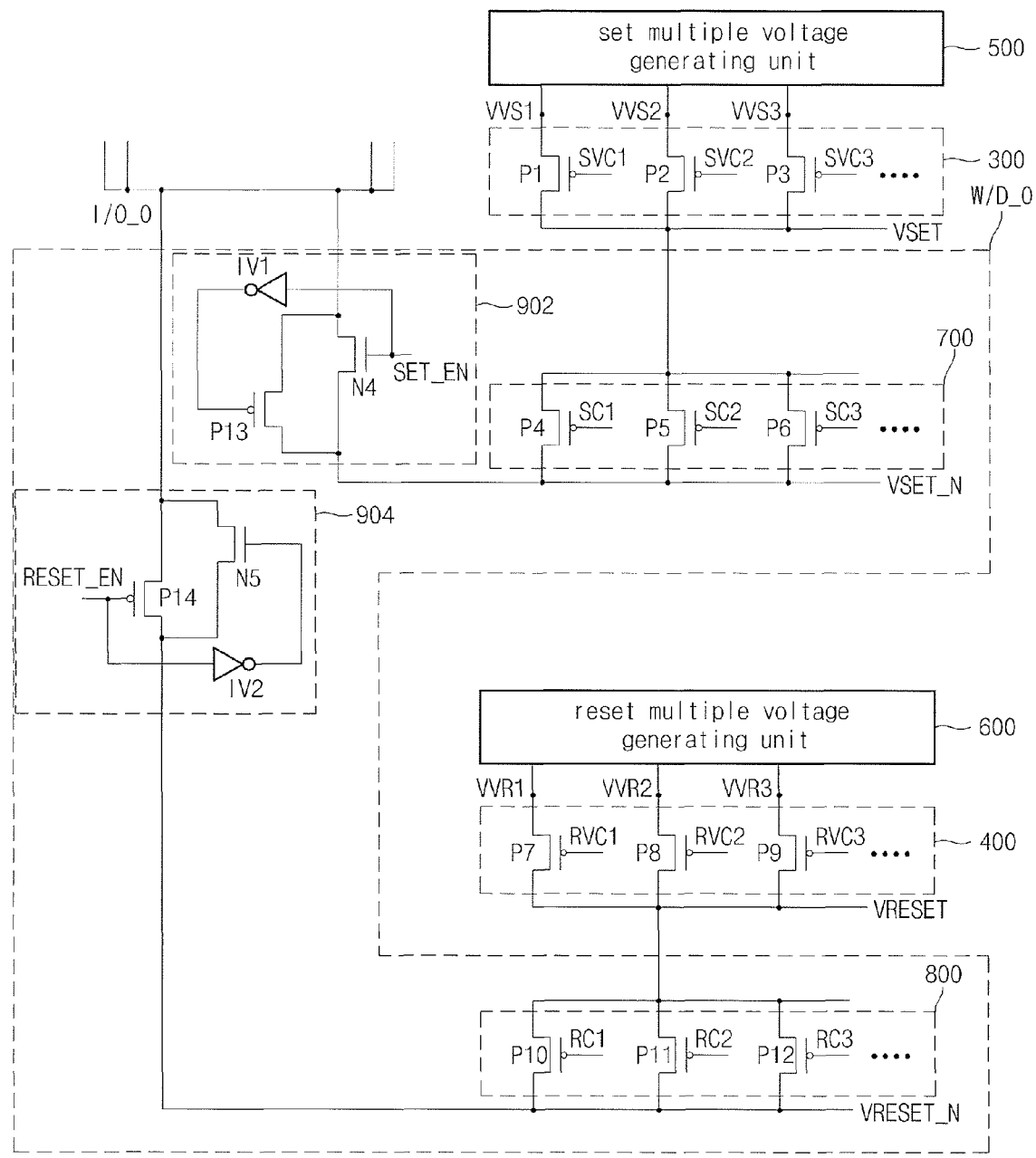
FIG. 6 is a circuit diagram showing the phase change memory device of FIG. 5.

FIG. 6 is a circuit diagram showing the phase change memory device of FIG. 5.

The phase change memory device of FIG. 6 comprises the write driving unit W/D_0, the set voltage selection adjusting unit 300, the reset voltage selection adjusting unit 400, the set multiple voltage generating unit 500, and the reset multiple voltage generating unit 600.

The write driving unit W/D_0 includes a set voltage fine-adjusting unit 700, a reset voltage fine-adjusting unit 800, a set voltage switching unit 902, and a reset voltage switching unit 904.

The set voltage fine-adjusting unit 700 includes a plurality of PMOS transistors P4~P6. The PMOS transistors P4~P6 are connected in parallel between the set voltage VSET receiving terminal and a set voltage node VSET_N and each gate of the PMOS transistors P4~P6 receives one of a plurality of set voltage fine-adjusting signals SC1~SC3.

The reset voltage fine-adjusting unit 800 includes a plurality of PMOS transistors P10~P12. The PMOS transistors P10~P12 are connected in parallel between the reset voltage VRESET receiving terminal and a reset voltage node VRESET_N and each gate of the PMOS transistors P10~P12 receives one of a plurality of reset voltage fine-adjusting signals RC1~RC3.

The set voltage switching unit 902 includes a NMOS transistor N4, a PMOS transistor P13, and an inverter IV1. The NMOS transistor N4 is connected between the input/output line I/O_0 and the set voltage node VSET_N and has a gate receiving a set voltage enable signal SET_EN. The PMOS transistor P13 is connected between the input/output line I/O_0 and the set voltage node VSET_N and has a gate receiving an output signal of the inverter IV1. The inverter IV1 inverts the set voltage enable signal SET_EN.

The reset voltage switching unit 904 includes a NMOS transistor N5, a PMOS transistor P14, and an inverter IV2. The NMOS transistor N5 is connected between the input/output line I/O_0 and the reset voltage node VRESET_N and has a gate receiving an output signal of the inverter IV2. The PMOS transistor P14 is connected between the input/output line I/O_0 and the reset voltage node VRESET_N and has a gate receiving a reset voltage enable signal RESET_EN. The inverter IV2 inverts the reset voltage enable signal RESET_EN.

The set multiple voltage generating unit 500 outputs a plurality of set multiple voltages VVS1~VVS3 each having a different voltage level. The set voltage selection adjusting unit 300 includes a plurality of PMOS transistors P1~P3. The PMOS transistors P1~P3 are connected between a set multiple voltage receiving terminal and the set voltage VSET receiving terminal and each gate of the PMOS transistors P1~P3 receives one of a plurality of set voltage adjusting signals SVC1~SVC3.

The reset multiple voltage generating units 600 outputs a plurality of reset multiple voltages VVR1~VVR3 each having a different voltage level. The reset voltage selection adjusting unit 400 includes a plurality of PMOS transistors P7~P9. The PMOS transistors P7~P9 are connected between a reset multiple voltage receiving terminal and the reset voltage VRESET receiving terminal and each gate of the PMOS transistors P7~P9 receives one of a plurality of reset voltage adjusting signals RVC1~RVC3.

Figure 7:
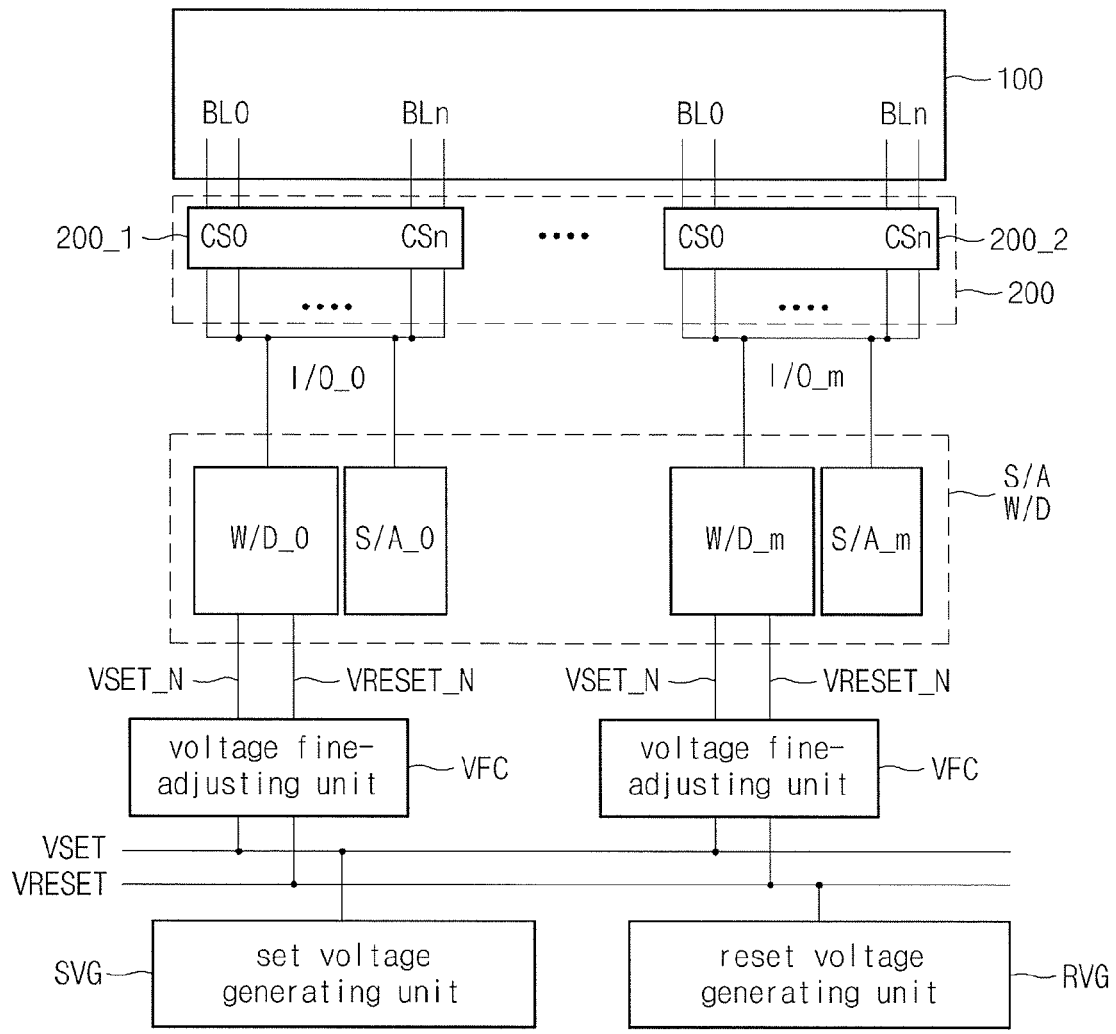
FIG. 7 is a block diagram showing a phase change memory device according to an embodiment of the present invention.

FIG. 7 is a block diagram showing a phase change memory device according to an embodiment of the present invention.

The phase change memory device of FIG. 7 comprises a cell array unit 100, a column selecting unit 200, a sense amplifier S/A, a write driving unit W/D, a voltage fine-adjusting unit VFC, a set voltage generating unit SVG, and a reset voltage generating unit RVG.

The voltage fine-adjusting unit VFC receives a set voltage VSET and a reset voltage VRESET to finely adjust a driving voltage to output a set voltage node VSET_N and a reset voltage node VRESET_N.

The set voltage generating unit SVG outputs one of a plurality of set multiple voltages VVS1~VVS3 (not shown in FIG. 7) each having a different voltage level to a set voltage VSET receiving terminal. The reset voltage generating unit RVG outputs one of a plurality of reset multiple voltages VVR1~VVR3 (not shown in FIG. 7) each having a different voltage level to a reset voltage VRESET receiving terminal.

Figure 8:
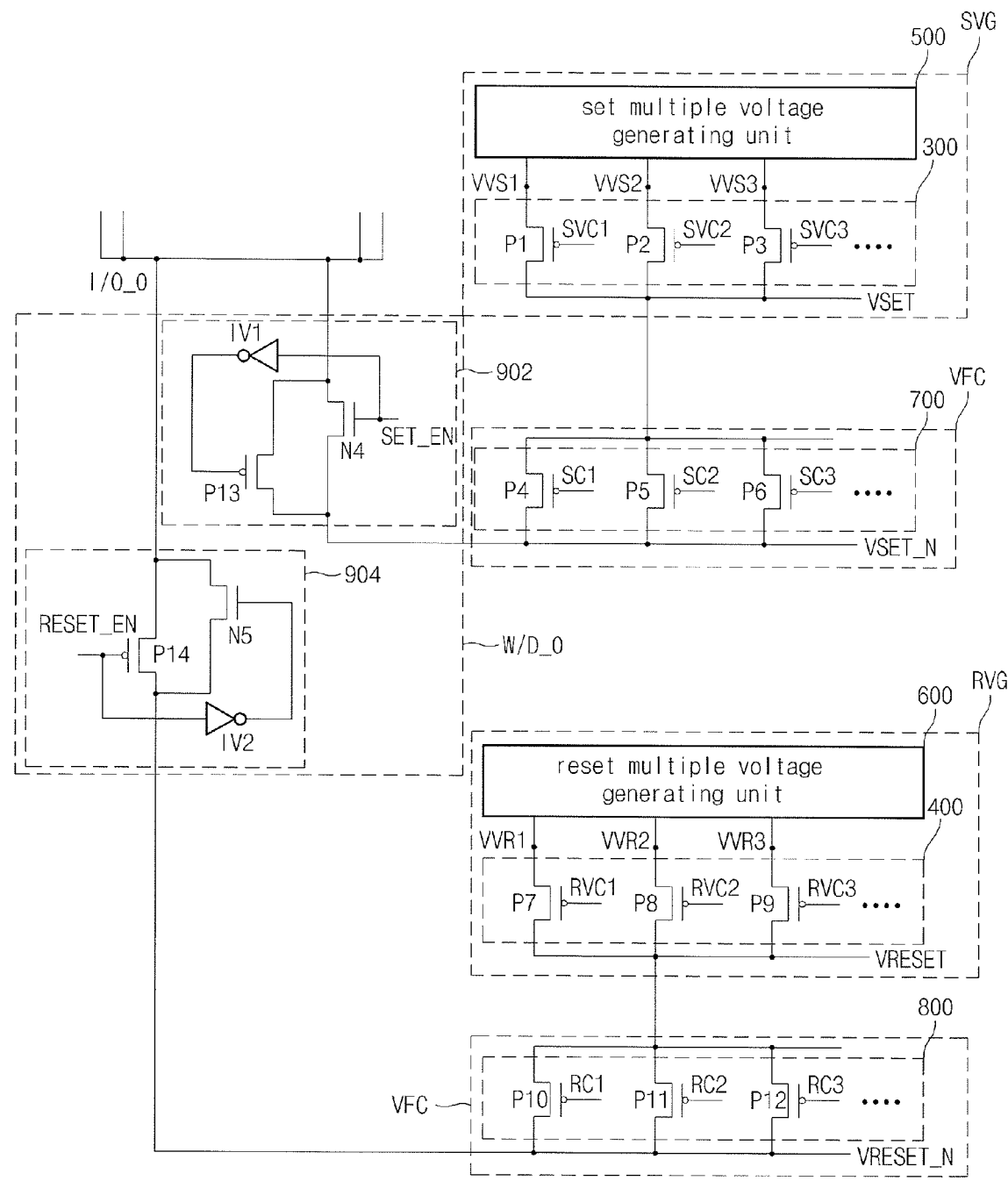
FIG. 8 is a circuit diagram showing the phase change memory device of FIG. 7.

FIG. 8 is a circuit diagram showing the phase change memory T5 device of FIG. 7.

The phase change memory device of FIG. 7, as shown in FIG. 8, comprises the write driving unit W/D_0, the voltage fine-adjusting unit VFC, the set voltage generating unit SVG, and the reset voltage generating unit RVG. The write driving unit W/D_0 includes a set voltage switching unit 902 and a reset voltage switching unit 904.

The set voltage switching unit 902 includes a NMOS transistor N4, a PMOS transistor P13, and an inverter IV1. The NMOS transistor N4 is connected between the input/output line I/O_0 and the set voltage node VSET_N and has a gate receiving a set voltage enable signal SET_EN. The PMOS transistor P13 is connected between the input/output line I/O_0 and the set voltage node VSET_N and has a gate receiving an output signal of the inverter IV1. The inverter IV1 inverts the set voltage enable signal SET_EN.

The reset voltage switching unit 904 includes a NMOS transistor N5, a PMOS transistor P14, and an inverter IV2. The NMOS transistor N5 is connected between the input/output line I/O_0 and the reset voltage node VRESET_N and has a gate receiving an output signal of the inverter IV2. The PMOS transistor P14 is connected between the input/output line I/O_0 and the reset voltage node VRESET_N and has a gate receiving a reset voltage enable signal RESET_EN. The inverter IV2 inverts the reset voltage enable signal RESET_EN.

The voltage fine-adjusting unit VFC includes a set voltage fine-adjusting unit 700 and a reset voltage fine-adjusting unit 800.

The set voltage fine-adjusting unit 700 includes a plurality of PMOS transistors P4~P6. The PMOS transistors P4~P6 are connected in parallel between the set voltage VSET receiving terminal and the set voltage node VSET_N and each gate of the PMOS transistors P4~P6 receives one of a plurality of set voltage fine-adjusting signals SC1~SC3.

The reset voltage fine-adjusting unit 800 includes a plurality of PMOS transistors P10~P12. The PMOS transistors P10~P12 are connected in parallel between the reset voltage VRESET receiving terminal and the reset voltage node VRESET_N and each gate of the PMOS transistors P10~P12 receives one of a plurality of reset voltage fine-adjusting signals RC1~RC3.

The set voltage generating unit SVG includes a set multiple voltage generating unit 500 and a set voltage selection adjusting unit 300.

The set multiple voltage generating unit 500 outputs a plurality of set multiple voltages VVS1~VVS3 each having a different voltage level. The set voltage selection adjusting unit 300 includes a plurality of PMOS transistors P1~P3. The PMOS transistors P1~P3 are connected in parallel between a set multiple voltage receiving terminal and the set voltage VSET receiving terminal and each gate of the PMOS transistors P1~P3 receives a plurality of set voltage adjusting signals SVC1~SVC3.

The reset voltage generating unit RVG includes a reset multiple voltage generating unit 600 and a reset voltage selection adjusting unit 400.

The reset multiple voltage generating units 600 outputs a plurality of reset multiple voltages VVR1~VVR3 each having a different voltage level. The reset voltage selection adjusting unit 400 includes a plurality of PMOS transistors P7~P9. The PMOS transistors P7~P9 are connected in parallel between a reset multiple voltage receiving terminal and the reset voltage VRESET receiving terminal and each gate of the PMOS transistors P7~P9 receives a plurality of reset voltage adjusting signals RVC1~RVC3.

Figure 9A:
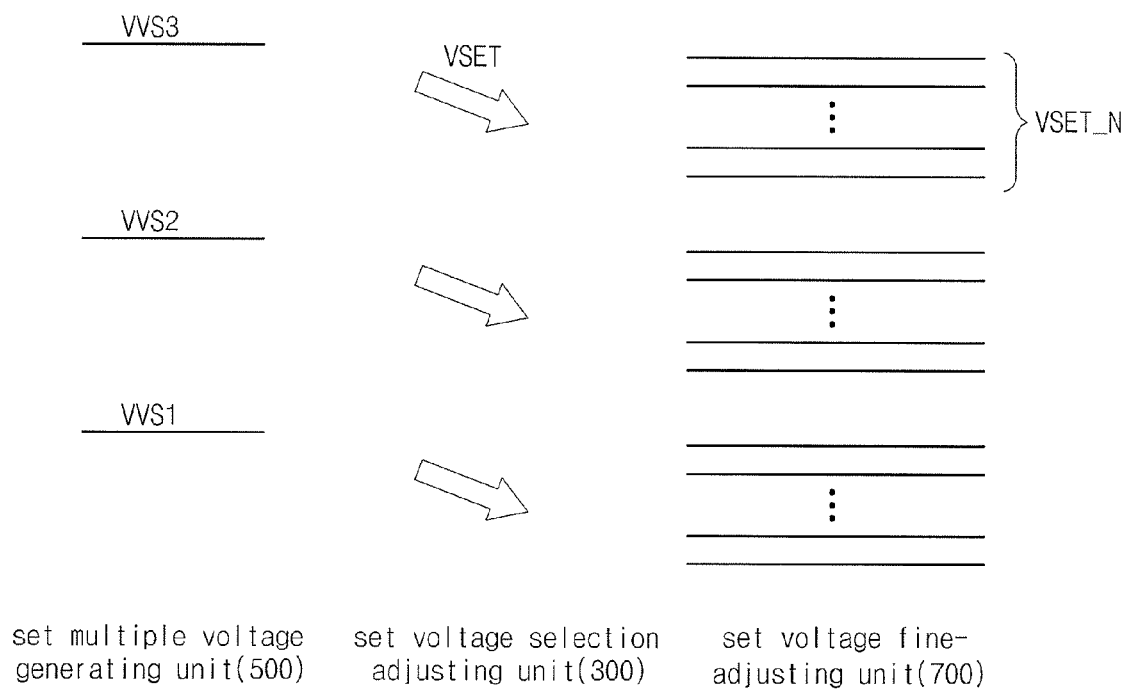
FIGS. 9a and 9b are diagrams illustrating an operating method of a phase change memory device according to an embodiment of the present invention.
Figure 9B:
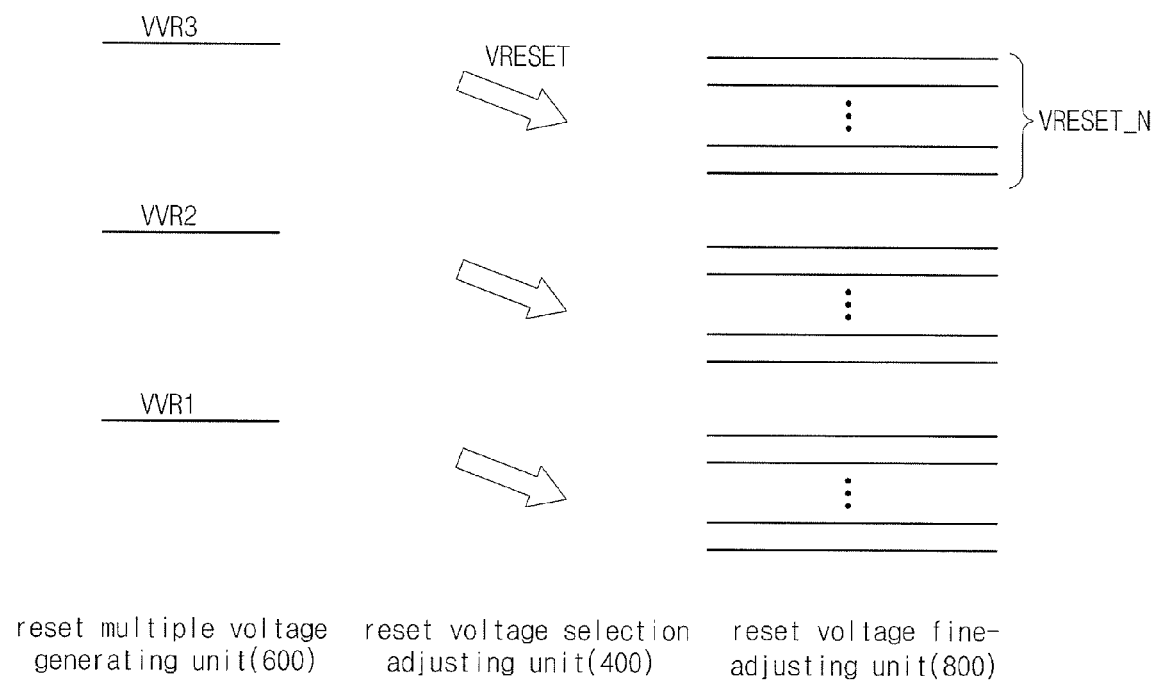

FIGS. 9a and 9b are diagrams showing an operating method of a phase change memory device according to an embodiment of the present invention.

FIG. 9a illustrates a method of writing set data to the unit cell C selected in a write mode.

The set multiple voltage generating unit 500 generates a plurality of set multiple voltages VVS1~VVS3 each having a different voltage level.

When the set voltage adjusting signal SVC1 is enabled, the PMOS transistor P1 of the set voltage selection adjusting unit 300 is turned on. The set multiple voltage VVS1 is then outputted as a set voltage VSET.

When the set voltage fine-adjusting signal SC1 is enabled, the PMOS transistor P4 of the set voltage fine-adjusting unit 700 is turned on. The set voltage VSET is then outputted to the set voltage node VSET_N through the PMOS transistor P4.

A voltage level of the set voltage VSET is finely adjusted depending on the number of the PMOS transistors that are turned on. For example, suppose that the PMOS transistor P4 acts as a resistor R1. The set voltage VSET has a voltage level that is adjusted according to a parallel resistance value of the resistor R1 and a cell resistance Rc.

When the set voltage enable signal SET_EN is enabled, the NMOS transistor N4 and PMOS transistor P13 of the set voltage switching unit 902 are turned on. The fine-adjusted set voltage VSET is then outputted to the input/output line I/O_0 via the set voltage node VSET_N.

The set voltage VSET transmitted to the input/output line I/O_0 is applied to the corresponding bit line BL. As a result, set data is written to the unit cell C.

That is, in order to write data with a set state in a write mode, the set multiple voltage generating unit 500 generates a plurality of set multiple voltages VVS1~VVS3 each having a different voltage level. The set voltage selection adjusting unit 300 then selects one of the set multiple voltages VVS1~VVS3 as the set voltage VSET. The set voltage fine-adjusting unit 700 then finely adjusts the set voltage VSET to output a plurality of lower voltage levels to the set voltage node VSET_N.

FIG. 9b illustrates a method of writing reset data to the unit cell C selected in a write mode.

The reset multiple voltage generating unit 600 generates a plurality of reset multiple voltages VVR1~VVR3 each having a different voltage level.

When the reset voltage adjusting signal RVC1 is enabled, the PMOS transistor P7 of the reset voltage selection adjusting unit 400 is turned on. The reset multiple voltage VVR1 is then outputted as a reset voltage VRESET.

When the reset voltage fine-adjusting signal RC1 is enabled, the PMOS transistor P10 of the reset voltage fine-adjusting unit 800 is turned on. The reset voltage VRESET is then outputted to the reset voltage node VRESET_N through the PMOS transistor P10. A voltage level of the reset voltage VRESET is finely adjusted depending on the number of the PMOS transistors that are turned on.

When the reset voltage enable signal RESET_EN is enabled, the PMOS transistor P14 and the NMOS transistor N5 of the reset voltage switching unit 904 are turned on. The fine-adjusted reset voltage VRESET is then outputted to the input/output line I/O_0 via the reset voltage node VRESET_N.

The reset voltage VRESET transmitted to the input/output line I/O_0 is applied to the corresponding bit line BL. As a result, reset data is written to the unit cell C.

That is, in order to write data with a reset state in a write mode, the reset multiple voltage generating unit 600 generates a plurality of reset multiple voltages VVR1~VVR3 each having a different voltage level. The reset voltage selection adjusting unit 400 selects one of the reset multiple voltages VVR1~VVR3 as the reset voltage VRESET. The reset voltage fine-adjusting unit 800 then finely adjusts the reset voltage VRESET to output a plurality of lower voltage levels to the reset voltage node VRESET_N.

In the phase change memory device according to the embodiments of the present invention, the set voltage VSET and the reset voltage VRESET are generated having m voltage levels and having n voltage levels that are finer than the m voltage levels.

As a result, the total number of voltage levels for the set voltage VSET and the reset voltage VRESET is m×n. In the write mode, the set voltage VSET and the reset voltage VRESET may be applied to correspond to individual characteristics of each unit cell C to perform an effective write operation.

As described above, a phase change memory device according to an embodiment of the present invention generates a driving voltage that corresponds to a data state at a plurality of different voltage levels to perform a write operation that may correspond to individual characteristics of phase change resistance cells.

Although a number of illustrative embodiments consistent with the invention have been described herein, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A phase change memory device comprising:
   a cell array unit including a phase change resistance cell positioned at an intersection of a word line and a bit line;
   a multiple voltage generating unit configured to generate a plurality of multiple voltages each having a different level;
   a voltage selection adjusting unit selecting one of the plurality of multiple voltages in response to a voltage adjusting signal to output a driving voltage; and
   a write driving unit fine-adjusting a voltage level of the driving voltage in response to a voltage fine-adjusting signal and supplying the driving voltage to the cell array unit.

2. The phase change memory device according to claim 1, wherein the voltage selection adjusting unit comprises:
   a set voltage selection adjusting unit outputting one of a plurality of set multiple voltages as a set driving voltage according to a plurality of set voltage adjusting signals; and
   a reset voltage selection adjusting unit outputting one of a plurality of reset multiple voltages as a reset driving voltage according to a plurality of reset voltage adjusting signals.

3. The phase change memory device according to claim 2, wherein the set voltage selection adjusting unit comprises a plurality of MOS transistors each connected in parallel between a set multiple voltage receiving terminal and a set driving voltage output terminal and having a gate receiving the set voltage adjusting signal.

4. The phase change memory device according to claim 2, wherein the reset voltage selection adjusting unit comprises a plurality of MOS transistors each connected in parallel between a reset multiple voltage receiving terminal and a reset driving voltage output terminal and having a gate receiving the reset voltage adjusting signal.

5. The phase change memory device according to claim 2, wherein the multiple voltage generating unit comprises:
   a set multiple voltage generating unit generating the set multiple voltages each of which having a different voltage level; and
   a reset multiple voltage generating unit generating the reset multiple voltages each of which having a different voltage level.

6. The phase change memory device according to claim 2, wherein the write driving unit comprises:
   a set voltage fine-adjusting unit finely adjusting the set driving voltage to a different voltage level according to a plurality of set voltage fine-adjusting signals;
   a reset voltage fine-adjusting unit to finely adjusting the reset driving voltage to a different voltage level according to a plurality of reset voltage fine-adjusting signals; and
   a switching unit selectively outputting an output signal of the set voltage fine-adjusting unit and an output signal of the reset voltage fine-adjusting unit.

7. The phase change memory device according to claim 6, wherein the set voltage fine-adjusting unit comprises a plurality of MOS transistors each connected in parallel between a set driving voltage receiving terminal and the switching unit and each of the plurality of MOS transistors having a gate receiving one of the plurality of set voltage fine-adjusting signals.

8. The phase change memory device according to claim 7, wherein the set voltage fine-adjusting unit adjusts the number of the MOS transistors that are turned on according to the plurality of set voltage fine-adjusting signals to finely adjust the set driving voltage.

9. The phase change memory device according to claim 6, wherein the reset voltage fine-adjusting unit comprises a plurality of MOS transistors each connected in parallel between a reset driving voltage terminal and the switching unit and each of the plurality of MOS transistors having a gate receiving one of the plurality of reset voltage fine-adjusting signals.

10. The phase change memory device according to claim 9, wherein the reset voltage fine-adjusting unit adjusts the number of the MOS transistors that are turned on according to the plurality of reset voltage fine-adjusting signals to finely adjust the reset driving voltage.

11. The phase change memory device according to claim 6, wherein the switching unit comprises:
    a set voltage switching unit supplying an output signal of the set voltage fine-adjusting unit to the cell array unit according to a set voltage enable signal; and
    a reset voltage switching unit supplying an output signal of the reset voltage fine-adjusting unit to the cell array unit according to a reset voltage enable signal.

12. The phase change memory device according to claim 11, wherein the set voltage switching unit comprises:
    a first switching element comprised of a MOS transistor connected between the set voltage fine adjusting unit and the cell array unit and having a gate receiving the set voltage enable signal; and a second switching element comprised of a MOS transistor connected between the set voltage fine-adjusting unit and the cell array unit and having a gate receiving an inverted signal of the set voltage enable signal.

13. The phase change memory device according to claim 11, wherein the reset voltage switching unit comprises:
a third switching element comprised of a MOS transistor connected between the reset voltage fine-adjusting unit and the cell array unit and having a gate receiving the reset voltage enable signal; and
a fourth switching element comprised of a MOS transistor connected between the reset voltage fine-adjusting unit and the cell array unit and having a gate receiving an inverted signal of the reset voltage enable signal.

14. The phase change memory device according to claim 1, wherein the phase change resistance cell comprises:
a phase change resistor sensing a change in a crystallization state changed according to a current to store data that corresponds to the crystallization state; and
a diode element connected between the phase change resistor and the word line.

15. A phase change memory device comprising:
a cell array unit including a phase change resistance cell positioned at an intersection of a word line and a bit line;
a voltage generating unit outputting one of a plurality of multiple voltages as a driving voltage according to a voltage adjusting signal;
a voltage fine-adjusting unit finely adjusting a voltage level of the driving voltage according to a voltage fine-adjusting signal; and
a write driving unit selectively supplying an output signal of the voltage fine-adjusting unit to the cell array unit.

16. The phase change memory device according to claim 15, wherein the voltage generating unit comprises:
a set multiple voltage generating unit generating a plurality of set multiple voltages each having a different voltage level;
a reset multiple voltage generating unit generating a plurality of reset multiple voltages each having a different voltage level;
a set voltage selection adjusting unit outputting one of the plurality of set multiple voltages as a set driving voltage according to a plurality of set voltage adjusting signals; and
a reset voltage selection adjusting unit outputting one of the plurality of reset multiple voltages as a reset driving voltage according to a plurality of reset voltage adjusting signals.

17. The phase change memory device according to claim 16, wherein the voltage fine-adjusting unit comprises:
a set voltage fine-adjusting unit finely adjusting the set driving voltage to a different voltage level according to a plurality of set voltage fine-adjusting signals; and
a reset voltage fine-adjusting unit finely adjusting the reset driving voltage to a different voltage level according to a plurality of reset voltage fine-adjusting signals.

18. The phase change memory device according to claim 17, wherein the write driving unit comprises a switching unit selectively outputting an output signal of the set voltage fine-adjusting unit and an output signal of the reset voltage fine-adjusting unit.

19. The phase change memory device according to claim 18, wherein the switching unit comprises:
a set voltage switching unit outputting the output signal of the set voltage fine-adjusting unit to the cell array unit according to a set voltage enable signal; and
a reset voltage switching unit outputting the output signal of the reset voltage fine-adjusting unit to the cell array unit according to a reset voltage enable signal.

20. The phase change memory device according to claim 19, wherein the set voltage switching unit comprises:
a first switching element comprised of a MOS transistor connected between the set voltage fine-adjusting unit and the cell array unit and having a gate receiving the set voltage enable signal; and
a second switching element comprised of a MOS transistor connected between the set voltage fine-adjusting unit and the cell array unit and having a gate receiving an inverted signal of the set voltage enable signal.

21. The phase change memory device according to claim 19, wherein the reset voltage switching unit includes:
a third switching element comprised of a MOS transistor connected between the reset voltage fine-adjusting unit and the cell array unit and having a gate receiving the reset voltage enable signal; and
a fourth switching element comprised of a MOS transistor connected between the reset voltage fine-adjusting unit and the cell array unit and having a gate receiving an inverted signal of the reset voltage enable signal.

* * * * *